United States Patent
Tran et al.

(10) Patent No.: US 9,520,462 B1
(45) Date of Patent: *Dec. 13, 2016

(54) SEMICONDUCTOR DEVICE HAVING CAPACITOR INTEGRATED THEREIN

(71) Applicant: Maxim Integrated Products, Inc., San Jose, CA (US)

(72) Inventors: Khanh Tran, Milpitas, CA (US); Joseph P. Ellul, San Jose, CA (US); Anuranjan Srivastava, Dublin, CA (US); Kiyoko Ikeuchi, Mountain View, CA (US); Scott W. Barry, Los Gatos, CA (US)

(73) Assignee: Maxim Integrated Products, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/948,942

(22) Filed: Nov. 23, 2015

Related U.S. Application Data

(63) Continuation of application No. 13/714,544, filed on Dec. 14, 2012, now Pat. No. 9,196,672.

(60) Provisional application No. 61/584,039, filed on Jan. 6, 2012.

(51) Int. Cl.
    *H01L 49/02* (2006.01)
(52) U.S. Cl.
    CPC .............. *H01L 28/91* (2013.01); *H01L 28/40* (2013.01)
(58) Field of Classification Search
    CPC .................................. H01L 28/40; H01L 28/91
    USPC .................................................. 257/532, 534
    See application file for complete search history.

(56) References Cited

U.S. PATENT DOCUMENTS

| | | | |
|---|---|---|---|
| 4,792,834 A | | 12/1988 | Uchida |
| 5,047,815 A | * | 9/1991 | Yasuhira et al. ............. 257/303 |
| 6,359,300 B1 | | 3/2002 | Economikos et al. |
| 7,839,622 B2 | | 11/2010 | Matters-Kammerer |
| 8,085,524 B2 | | 12/2011 | Roozeboom et al. |
| 2006/0051938 A1 | | 3/2006 | Connell et al. |
| 2006/0158829 A1 | * | 7/2006 | Kwon et al. .................. 361/313 |

(Continued)

FOREIGN PATENT DOCUMENTS

| | | |
|---|---|---|
| CN | 101341576 A | 1/2009 |
| CN | 101636826 A | 1/2010 |
| EP | 0715350 B1 | 3/2006 |

OTHER PUBLICATIONS

Roozeboom, F. et al., "Ultrahigh-density (.0.4 μF/mm2) trench capacitors in silicon," First Int. Workshop on Power Supply on Chip (PowerSoC08), Sep. 22-24, 2008, Cork, Ireland.

(Continued)

*Primary Examiner* — Ha Tran T Nguyen
*Assistant Examiner* — Aaron Dehne
(74) *Attorney, Agent, or Firm* — Advent, LLP

(57) ABSTRACT

Semiconductor devices are described that include a capacitor integrated therein. In an implementation, the semiconductor devices include a substrate including a dopant material of a first conductivity type. A plurality of trenches are formed within the substrate. The semiconductor devices also include a diffusion region having dopant material of a second conductivity type formed proximate to the trenches. A capacitor is formed within the trenches and at least partially over the substrate. The capacitor includes at least a first electrode, a second electrode, and a dielectric material formed between the first and second electrodes.

18 Claims, 8 Drawing Sheets

(56) References Cited

U.S. PATENT DOCUMENTS

| | | |
|---|---|---|
| 2006/0214230 A1 | 9/2006 | Shimokawa |
| 2008/0291601 A1* | 11/2008 | Roozeboom et al. ..... 361/306.2 |
| 2010/0117612 A1 | 5/2010 | Klootwijk et al. |
| 2010/0181645 A1* | 7/2010 | Marenco ....................... 257/532 |
| 2010/0316911 A1 | 12/2010 | Tesson et al. |
| 2011/0084360 A1* | 4/2011 | Kemerer et al. .............. 257/532 |
| 2012/0012982 A1* | 1/2012 | Korec et al. .................. 257/533 |
| 2012/0196424 A1* | 8/2012 | Krishnan et al. ............. 438/387 |
| 2013/0069198 A1* | 3/2013 | Claeys et al. ................. 257/532 |

OTHER PUBLICATIONS

Bunel, Catherine, "3D Capacitors : manufacturing and applications", www.ipdia.com, pp. 1-27.
Murray, Franck et al., "Silicon-Based System-in-Package: Breakthroughs in Miniaturized and 'Nano'-integration supported by Very High Quality Passives and Systems Level Design Tools," pp. 1-11.
Office Action dated Jul. 25, 2016 for Chinese Appln. No. 201310002525.4.

\* cited by examiner

SEMICONDUCTOR DEVICE HAVING CAPACITOR INTEGRATED THEREIN

CROSS-REFERENCE TO RELATED APPLICATIONS

The present application is a continuation under 35 U.S.C. 120 of U.S. patent application Ser. No. 13/714,544, filed Dec. 14, 2012, entitled "SEMICONDUCTOR DEVICE HAVING A CAPACITOR INTEGRATED THEREIN," which is hereby incorporated by reference in its entirety.

BACKGROUND

Capacitors are passive storage elements that are used in various integrated circuits. For example, capacitors may be utilized to store charge, block direct current (DC), block noise, DC to DC conversion, alternating current (AC) to AC conversion, filtering, and so forth.

SUMMARY

Semiconductor devices are described that include a capacitor integrated therein. In an implementation, the semiconductor devices include a substrate including a dopant material of a first conductivity type. Trenches are formed within the substrate, and a diffusion region having dopant material of a second conductivity type is formed proximate to the trenches. A metal-insulator-metal (MIM) capacitor is formed within the trenches and at least partially over the substrate. The metal-insulator-metal capacitor includes at least a first electrode, a second electrode, and a dielectric material formed between the first and second electrodes.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

DRAWINGS

The detailed description is described with reference to the accompanying figures. The use of the same reference numbers in different instances in the description and the figures may indicate similar or identical items.

DETAILED DESCRIPTION

Overview

Capacitor values are directly proportional to the area of the capacitor. Thus, high-value capacitors (e.g., capacitors having values in the nanofarad [nF] and microfarad [μF] range) may require a significant amount of chip space if integrated on-chip. Instead, capacitors may be integrated on printed circuit boards, or the like. However, as devices become more compact, printed circuit board space is becoming limited.

Therefore, techniques are described to form semiconductor devices having a metal-insulator-metal capacitor integrated therein. In an implementation, the semiconductor devices include a substrate including a dopant material of a first conductivity type. For example, the substrate may be a P-- substrate. A plurality of trenches are formed within the substrate. The trenches may have an aspect ratio ranging from about fifty to one (50:1) to about one hundred and fifty to one (150:1). The semiconductor devices also include a diffusion region having dopant material of a second conductivity type formed proximate to the trenches. For example, the diffusion region may be doped with N+ dopant materials. A capacitor is formed within the trenches and at least partially over the substrate. The capacitor includes at least a first electrode, a second electrode, and a dielectric material formed between the first and second electrodes. In an implementation, the capacitor may be configured as a single metal-insulator-metal (MIM) capacitor. In another implementation, the capacitor may be configured as a dual MIM capacitor. The semiconductor device described herein may allow for capacitors integrated on-chip having capacitive densities ranging from about three hundred femtoFarads per square micrometer (300 fF/μm$^2$) to about two thousand femtoFarads per square micrometer (2000 fF/μm$^2$).

In the following discussion, an example semiconductor device is first described. Exemplary procedures are then described that may be employed to fabricate the example semiconductor device.

Example Implementations

Figure 1A:
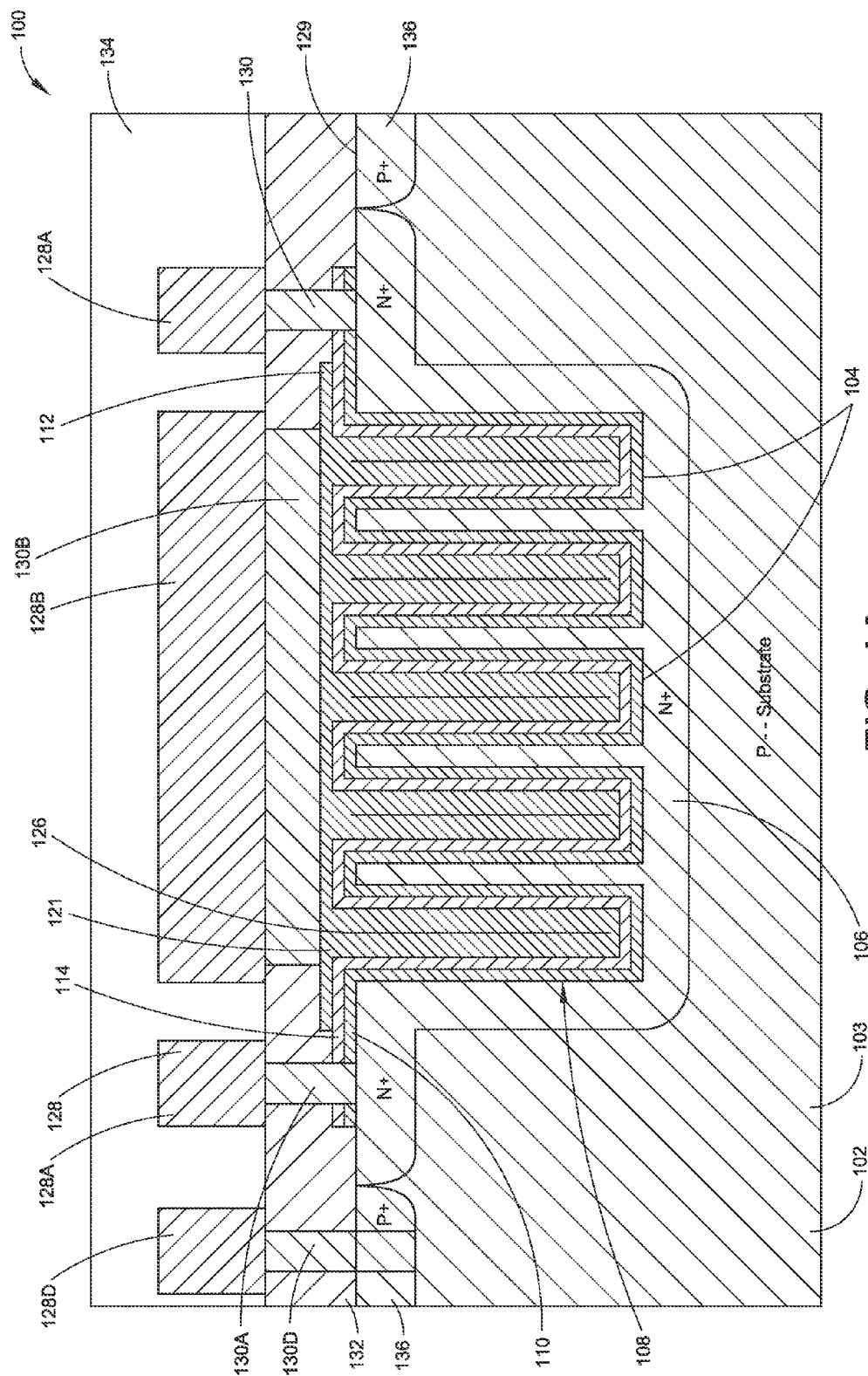
FIG. 1A is a diagrammatic partial cross-sectional view illustrating an implementation of a semiconductor device in accordance with an example implementation of the present disclosure, wherein the semiconductor wafer includes a capacitor integrated therein.
Figure 1B:
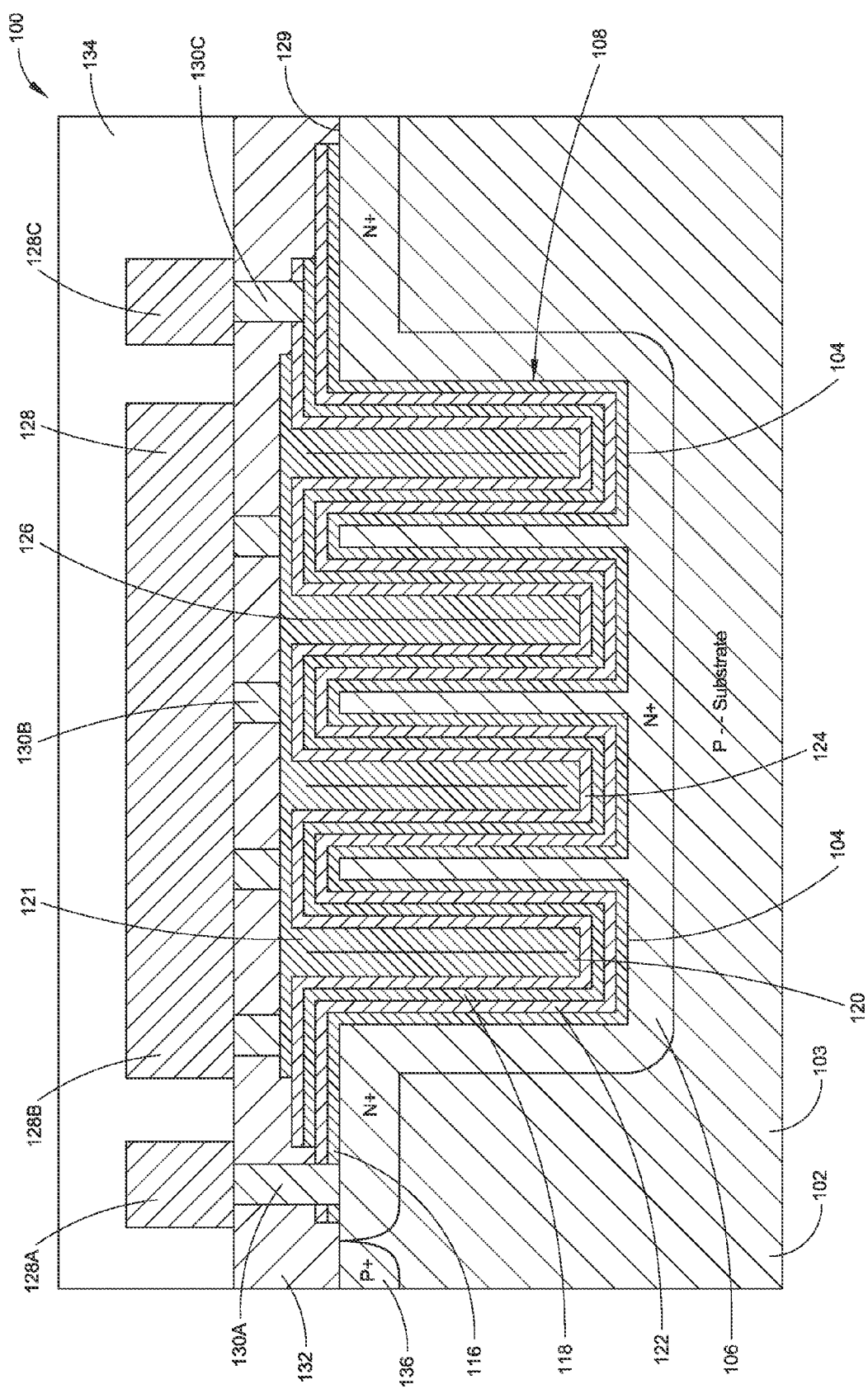
FIG. 1B is a diagrammatic partial cross-sectional view illustrating another implementation of a semiconductor device in accordance with another example implementation of the present disclosure, wherein the capacitor is implemented in a dual capacitor configuration.

FIGS. 1A and 1B illustrate an example semiconductor device 100 in accordance with example implementations of the present disclosure. As shown, the semiconductor device 100 includes a substrate 102. The substrate 102 comprises a base material utilized to form one or more integrated circuit devices through various semiconductor fabrication techniques, such as photolithography, ion implantation, deposition, etching, and so forth. In one or more implementations, the substrate 102 comprises a portion of a silicon wafer that may be configured in a variety of ways. For example, the substrate 102 may comprise a portion of an n-type silicon wafer or a portion of a p-type silicon wafer. In an implementation, the substrate 102 may comprise group V elements (e.g., phosphorus, arsenic, antimony, etc.) configured to furnish n-type charge carrier elements. In another implementation, the substrate 102 may comprise group IIIA elements (e.g., boron, etc.) configured to furnish p-type charge carrier elements. In a specific implementation, the substrate 102 includes a P-- region 103. However, it is contemplated that other conductive types may be utilized (e.g., a P- region, etc.).

The substrate 102 includes a plurality of trenches 104 formed therein. In embodiments, the trenches 104 may be elongated trenches. The trenches 104 have a depth of about twenty micrometers (20 μm) or greater. For example, the depth of the trenches 104 may be about forty micrometers (40 μm). In a specific implementation, the width of each trench 104 may be approximately five hundred nanometers (500 nm) or less, and the depth of each trench 104 may be about thirty micrometers (30 μm). The pitch of the trenches 104 may be about eight hundred nanometers (800 nm), or less in some configurations. The length of the trenches may be two micrometers (2 um) to twenty micrometers (20 um). In one or more implementations, the trenches 104 may have an aspect ratio of about fifty to one (50:1) to about one hundred and fifty to one (150:1). In another implementation, the aspect ratio may range from about seventy-five to one (75:1) to about one hundred and twenty-five to one (125:1). In yet another implementation, the aspect ratio may range from about one hundred and twenty-five to one (125:1) to about one hundred and twenty-five to one (125:1) to about one hundred and fifty to one (150:1). The trenches 104 serve to allow a capacitor having a capacitor density of up to about two thousand FemtoFarads per square micrometer (2000 fF/μm$^2$) to be formed therein, as described herein. In an implementation, the trenches 104 allow a subsequent N+ diffusion region 106 to form proximate to the trenches 104. The N+ diffusion region 106 is disposed over the P−− region 103 of the substrate 102 (see FIGS. 1A and 1B).

As shown in FIGS. 1A and 1B, the semiconductor device 100 includes a capacitor 108 formed within the trenches 104. In implementations, the capacitor 108 is a single metal-insulator-metal (MIM) capacitor (FIG. 1A) or a dual MIM capacitor (FIG. 1B). For example, the single MIM capacitor (e.g., capacitor 108 shown in FIG. 1A) includes a first electrode 110, a second electrode 112, and a dielectric layer 114 disposed between the first and second electrodes 110, 112. The first and second electrodes 110, 112 comprise a conductive material, such as titanium-nitride (TiN), doped polysilicon or the like. The dielectric layer 114 may comprise of insulating materials such as silicon dioxide ($SiO_2$), silicon nitride (SiN), silicon oxynitride (SiON) or the like, as well as classes of high-k materials such as Zirconium Oxide ($ZrO_2$), Erbium Oxide ($ErO_2$), Hafnium Oxide ($HfO_2$), Aluminum Oxide ($Al_2O_3$), or the like. The dielectric layer 114 may be a combinatorial multi-layer stack of above dielectric materials. In one or more implementation, the dielectric layer 114 comprises a high-k material, such as alternating layers of Hafnium Oxide ($HfO_2$) and Aluminum Oxide ($Al_2O_3$), or the like. The ratio of HfO2 to Al2O3 may be chosen to target desired dielectric permittivity and electrical breakdown. The N+ diffusion region 106 provides a low-resistance shunt path across the capacitor 108 for the first electrode 110 and also may serve to electrically isolate the capacitor 108 from other components formed within the substrate 102 (e.g., capacitors, integrated circuits, etc.).

The dual MIM capacitor (e.g., capacitor 108 shown in FIG. 1B) includes a first electrode 116, a second electrode 118, and a third electrode 120. The dual MIM capacitor also includes a first dielectric layer 122 disposed between the first electrode 116 and the second electrode 118, as well as a second dielectric layer 124 disposed between the second electrode 118 and the third electrode 120. The electrodes 116, 118, 120 comprise a conductive material (e.g., a TiN material, doped polysilicon or the like), and the dielectric layers 122, 124 comprise a high-k material (e.g., $ZrO_2$, $ErO_2$, $HfO_2$, $Al_2O_3$, etc. or combinatorial multi-layer stack thereof). As described above, one implementation employs alternating layers of HfO2 and Al2O3 with the ratio of $HfO_2$ to $Al_2O_3$ tailored for desired dielectric permittivity and electrical breakdown. For example, a ratio of HfO2 to Al2O3 may range from at least approximately one and a half to at least approximately two and a half (1.5 to 2.5). In an implementation, the second electrode 112 of the single MIM capacitor, or the second electrode 118 and the third electrode 120 of the dual MIM capacitor may further include an additional conductive layer within to enhance the thickness of the respective electrode 112, 118, 120. Additionally, the conductive layer may be low-stress and serves to fill and seal the trenches after the capacitor formation. The conductive layer may comprise a doped polysilicon layer, doped polysilicon-oxide-amorphous silicon layer, a doped silicon germanium layer, or the like.

The device 100 may include seams 126 that are configured to facilitate lower stress (e.g., facilitate stress management) to the capacitor 108. In an implementation, the second electrode 112 of the single MIM capacitor configuration defines one or more seams 126. In another implementation, the third electrode 120 of the dual MIM capacitor configuration defines one or more seams 126. The seams 126 allow the respective electrodes 112, 120 to expand and/or to contract during various fabrication and operating cycles (e.g., thermal cycling, etc.). The seams 126 may be defined during the deposition of the respective electrodes 112, 120.

The semiconductor device 100 also includes conductive layers 128 disposed over a first surface 129 of the substrate 102. The conductive layers 128 serve to provide electrical interconnectivity between the capacitor 108 and other components associated with the device 100 (e.g., integrated circuits, integrated circuit devices, etc.). The conductive layers 128 may comprise one or more suitable top metal layer (e.g., a metal 1 layer, a metal 2 layer, a metal 3 layer, etc.). In an implementation, the conductive layer 128 may be aluminum, copper, gold or the like. The formation of the conductive layer 128 may be by deposition/masking/etching, or by etching/filling/chemical-mechanical-polishing (e.g., a Damascene technique) appropriate to the choice of conductor material selected. The conductive layers 128 may be connected to the electrodes of the capacitor 108 through one or more vias 130. For example, the single MIM capacitor configuration, as shown in FIG. 1A, includes a conductive layer 128A connected to the first electrode 110 through a first via 130A, and a conductive layer 128B is connected to the second electrode 112 through a second via 130B. In another example, the dual MIM capacitor configuration, as shown in FIG. 1B, includes a conductive layer 128A connected to the first electrode 116 through a first via 130A, a conductive layer 128C is connected to the second electrode 118 through a second via 130C, and a conductive layer 128B is connected to the third electrode 120 through a third via 130B.

The device 100 also includes an insulation layer 132 disposed between the trenches 104 and the conductive layer 128. The insulation layer 132 may comprise benzocyclobutene polymer (BCB), Polyimide (PI), Polybenzoxazole (PBO), silicon dioxide ($SiO_2$), and so forth. As shown, the vias 130 extend at least substantially through the insulation layer 132 to furnish an electrical connection between the conductive layers 128 and the various electrodes of the capacitor 108. A layer of silicon nitride (SiN), silicon oxynitride (SiON), or like material may be used as an etch-stop over electrode regions to facilitate via etching. Vias 130 may comprise of plugs of TiN and Tungsten material or can be openings for conductors 128 to directly contact various electrodes of the capacitor 108.

As shown in FIGS. 1A and 1B, the semiconductor device 100 includes a passivation layer 134 disposed over the conductive layers 128 and the insulation layer 132. In an implementation, the passivation layer 134 may be a stack of oxide/nitride material ($SiO_2$/SiN), or the like.

The semiconductor device 100 may also include one or more isolation regions 136. The isolation regions 136 are P+ doped regions that prevent field inversion of the parasitic field MOS transistor created by the conductive layer 128 over the insulation layer 132 over the P-- substrate 102 to assist in electrically isolating the capacitor 108 from other components (e.g., capacitors, integrated circuits, etc.) formed within the substrate 102. In another implementation, as shown in FIG. 1A, to enable a voltage application to the P-- substrate 102 from the device frontside, the P+ doped region 136 may provide a low-resistance contact to connect P-- substrate 102 to conductive layer 128D through via 130D. It is contemplated that the semiconductor device 100 shown in FIG. 1B may also employ a voltage application to the P-- substrate 102 from the device frontside as well.

Example Fabrication Processes

Figure 2:
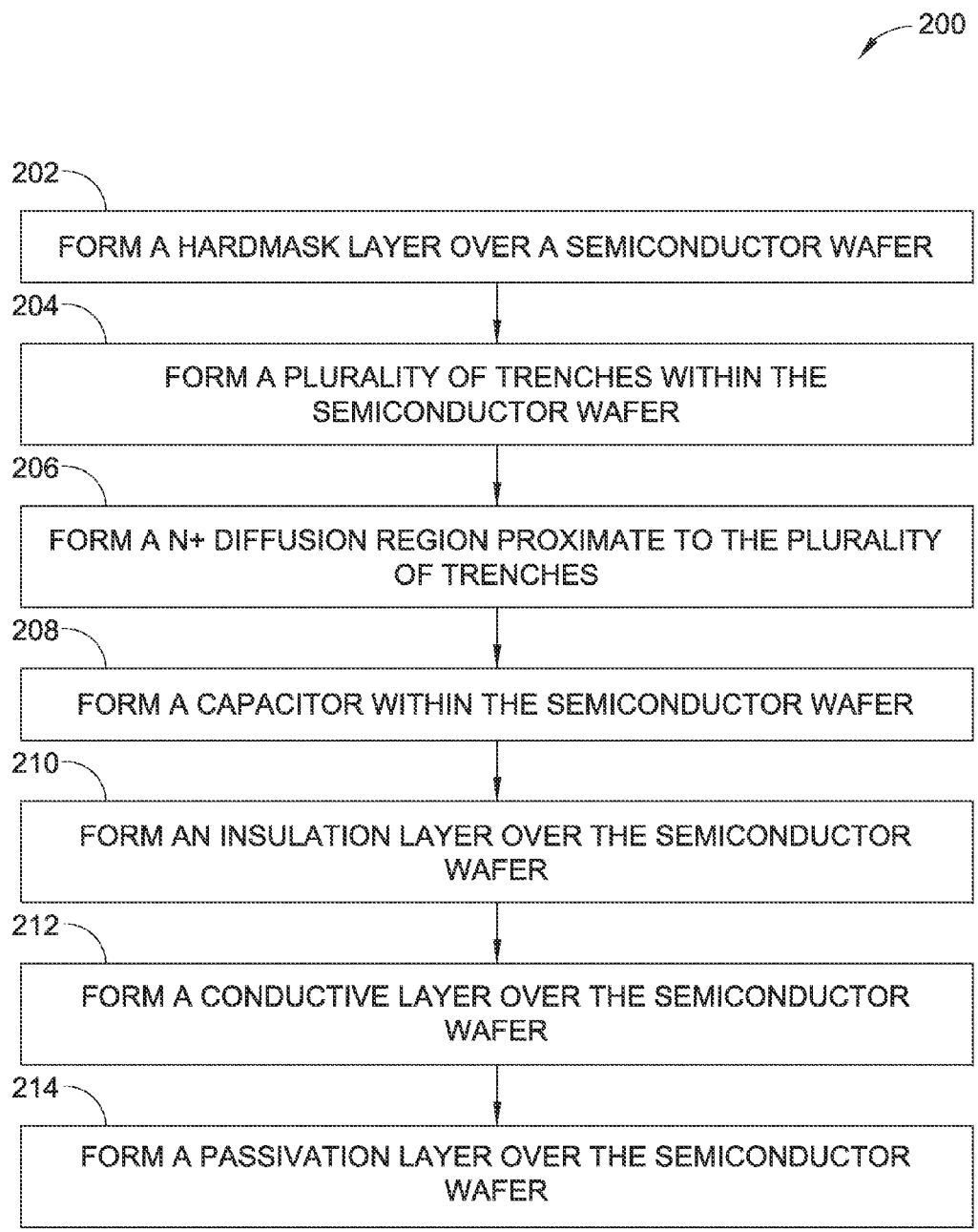
FIG. 2 is a flow diagram illustrating a process in an example implementation for fabricating semiconductor devices having a capacitor integrated therein, such as the devices shown in FIGS. 1A and 1B.
Figure 3A:
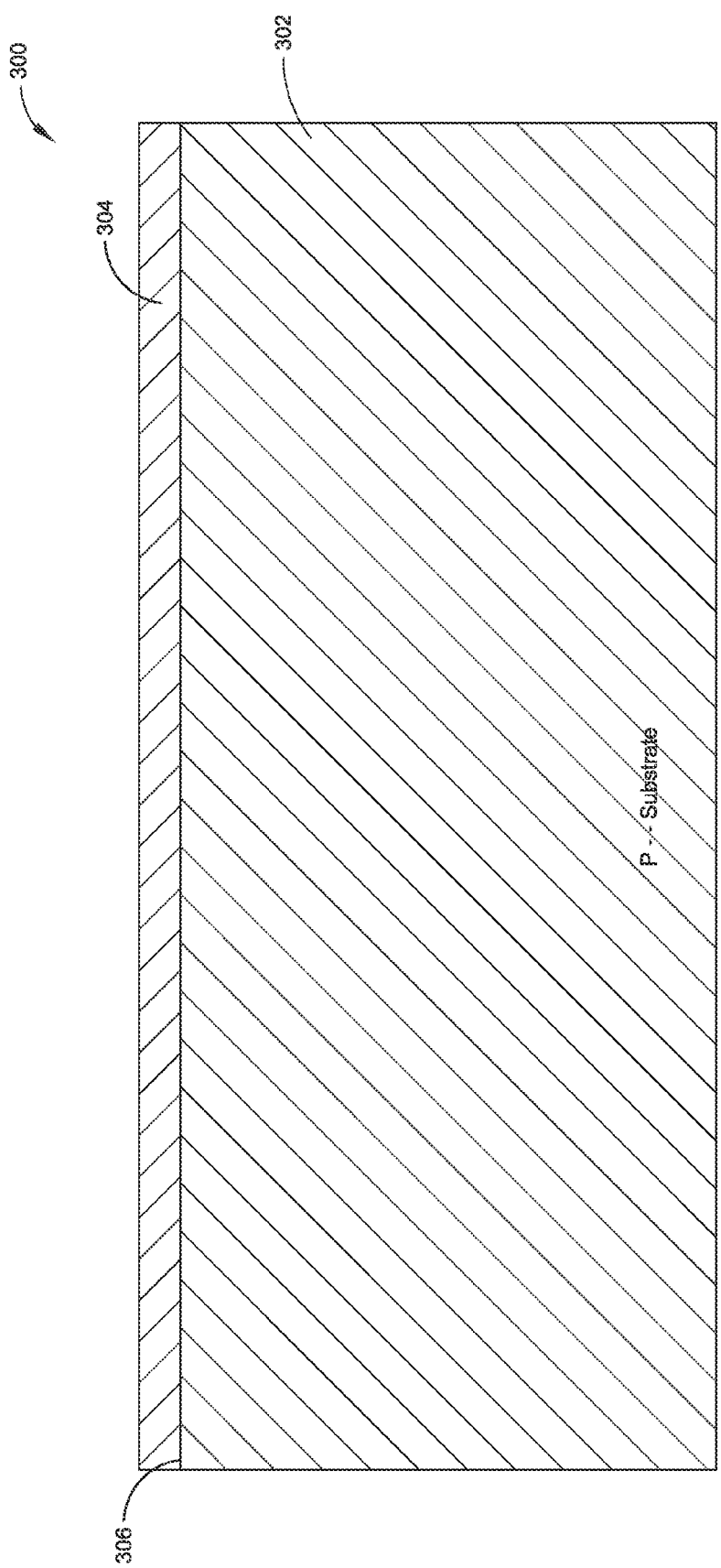
FIGS. 3A through 3E are diagrammatic partial cross-sectional views illustrating the fabrication of a semiconductor device, such as the device shown in FIG. 1A, in accordance with the process shown in FIG. 2.
Figure 3B:
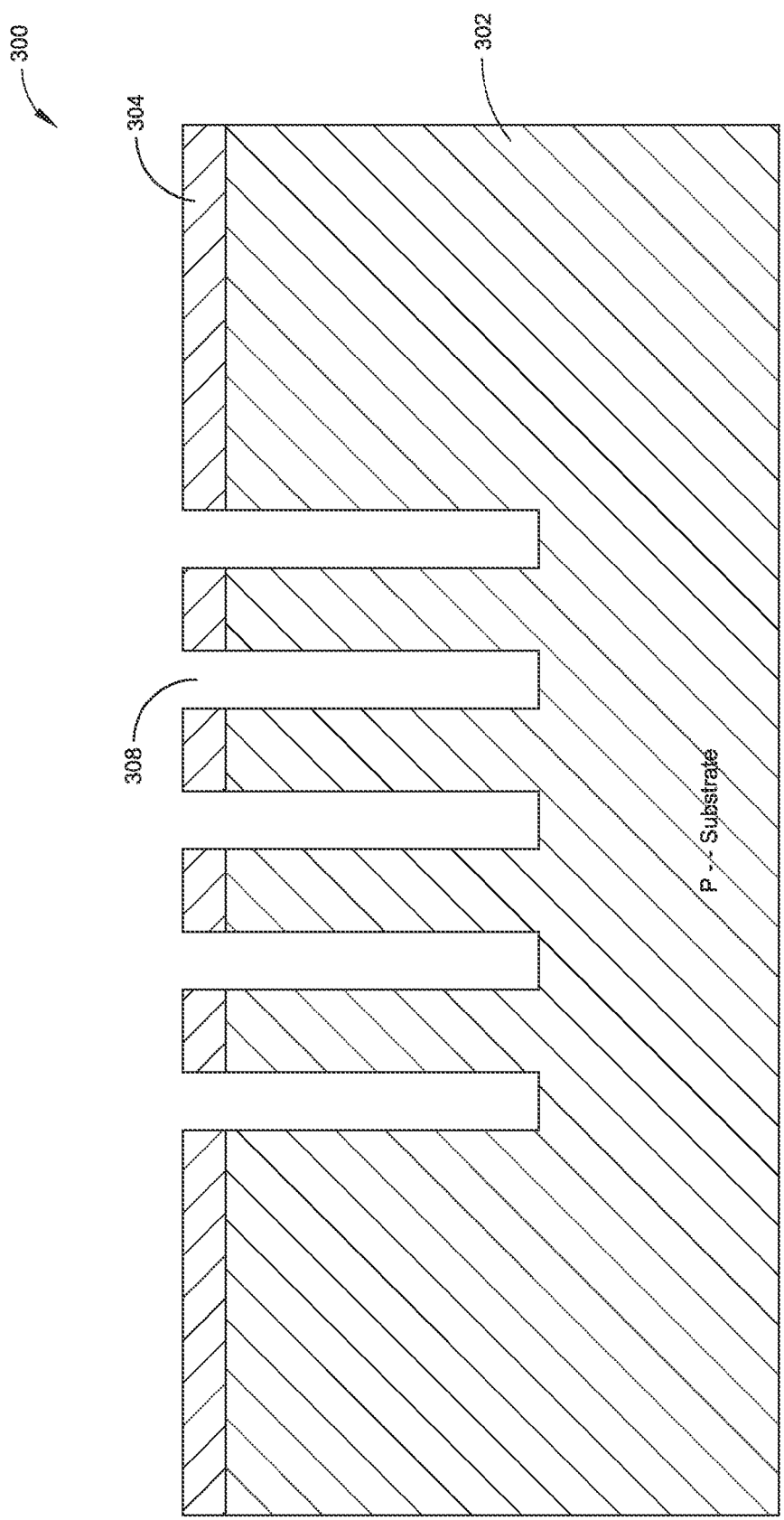

FIG. 2 illustrates an example process 200 that employs semiconductor fabrication techniques to fabricate semiconductor devices having a capacitor integrated therein, such as the device 100 shown in FIGS. 1A and 1B. FIGS. 3A through 3E illustrate formation of example semiconductor devices 300 in an example semiconductor wafer 302. As illustrated in FIG. 2, a hardmask layer is formed over a semiconductor wafer (Block 202). In an implementation, as shown in FIG. 3A, the wafer 302 includes a dopant material of a first conductivity type. For example, the wafer 302 is a P-- semiconductor wafer (e.g., the wafer is doped P--, or the like). A hardmask layer 304 is formed (e.g., deposited) over a surface 306 of the wafer 302. In an implementation, the thickness of the hardmask layer 304 may range from about two micrometers (2 μm) to about six micrometers (6 μm). The hardmask layer 304 may be an oxide layer, or the like. It is contemplated that the type of wafer may be selected to utilize an N++ to P-- diode to substrate having a low parasitic capacitance.

A plurality of trenches are formed in the semiconductor wafer (Block 204). Suitable i-line or deep ultraviolet (DUV) lithography techniques may be utilized to form the plurality of trenches 308 (see FIG. 3B). For example, the hardmask layer 304 may be patterned (e.g., depositing photoresist over the hardmask layer and patterning the photoresist) and etched (e.g., a deep reactive-ion etching technique) to form the trenches 308. The thickness of the hardmask layer 304 assists in facilitating formation of trenches 308 having a depth ranging from about (20 μm) to about forty micrometers (40 μm). In a specific implementation, a suitable Bosch etching technique may be utilized to etch the wafer 302 to form the trenches 308.

Figure 3C:
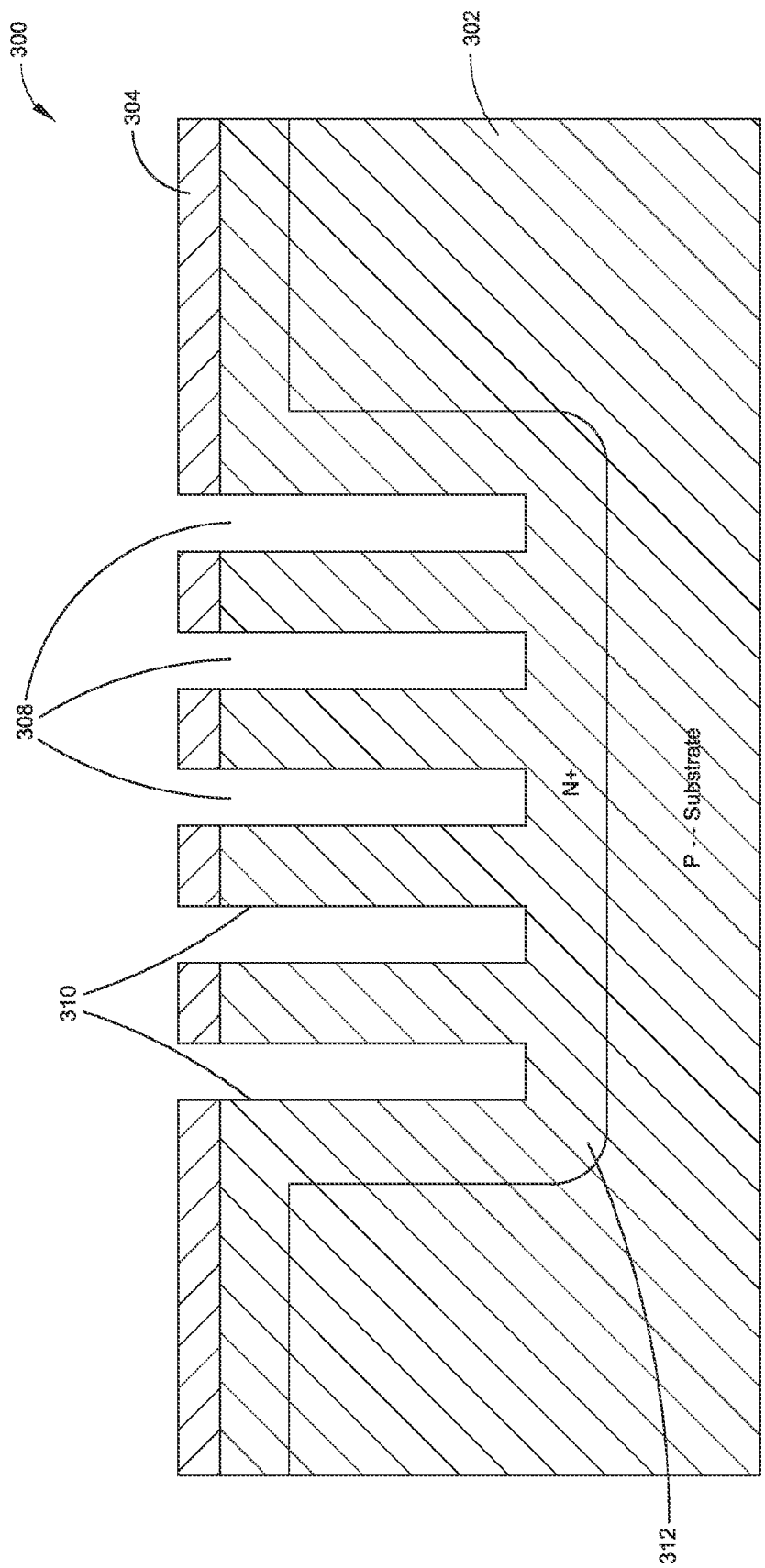

Once the trenches are formed, an N+ diffusion region is formed proximate to the trenches (Block 206). As shown in FIG. 3C, the trench sidewalls 310 are subjected to a diffusion deposition to form a diffusion region 312 having dopant material of a second conductivity type. For example, the diffusion region 312 is a N+ diffusion region 312 proximate (e.g., adjacent) to the trenches 308. In an implementation, the N+ diffusion deposition is performed prior to the hardmask layer 304 being removed to allow the N+ diffusion region 312 to self-align with respect to the trenches 308. The N+ diffusion region 312 may also provide capacitor-to-capacitor bulk isolation. In an implementation, the N+ diffusion doping concentration is greater than $1\times10^{19}$ atoms per square centimeter to achieve lower equivalent series resistance. Additionally, in an implementation, a phosphoryl chloride ($POCl_3$) doping step may be performed at less than nine hundred degrees Celsius (<900° C.), which may slow the reaction kinetics so that the sidewall and the bottom of the trenches 308 are at least substantially uniformly doped. For example, the doping process temperature may range from at least approximately eight hundred and seventy-five degrees Celsius (875° C.) to at least approximately eight hundred and ninety-five degrees Celsius (895° C.). In another example, the doping process temperature may range from at least approximately eight hundred and eighty degrees Celsius (880° C.) to at least approximately eight hundred and ninety degrees Celsius (890° C.).

Figure 3D:
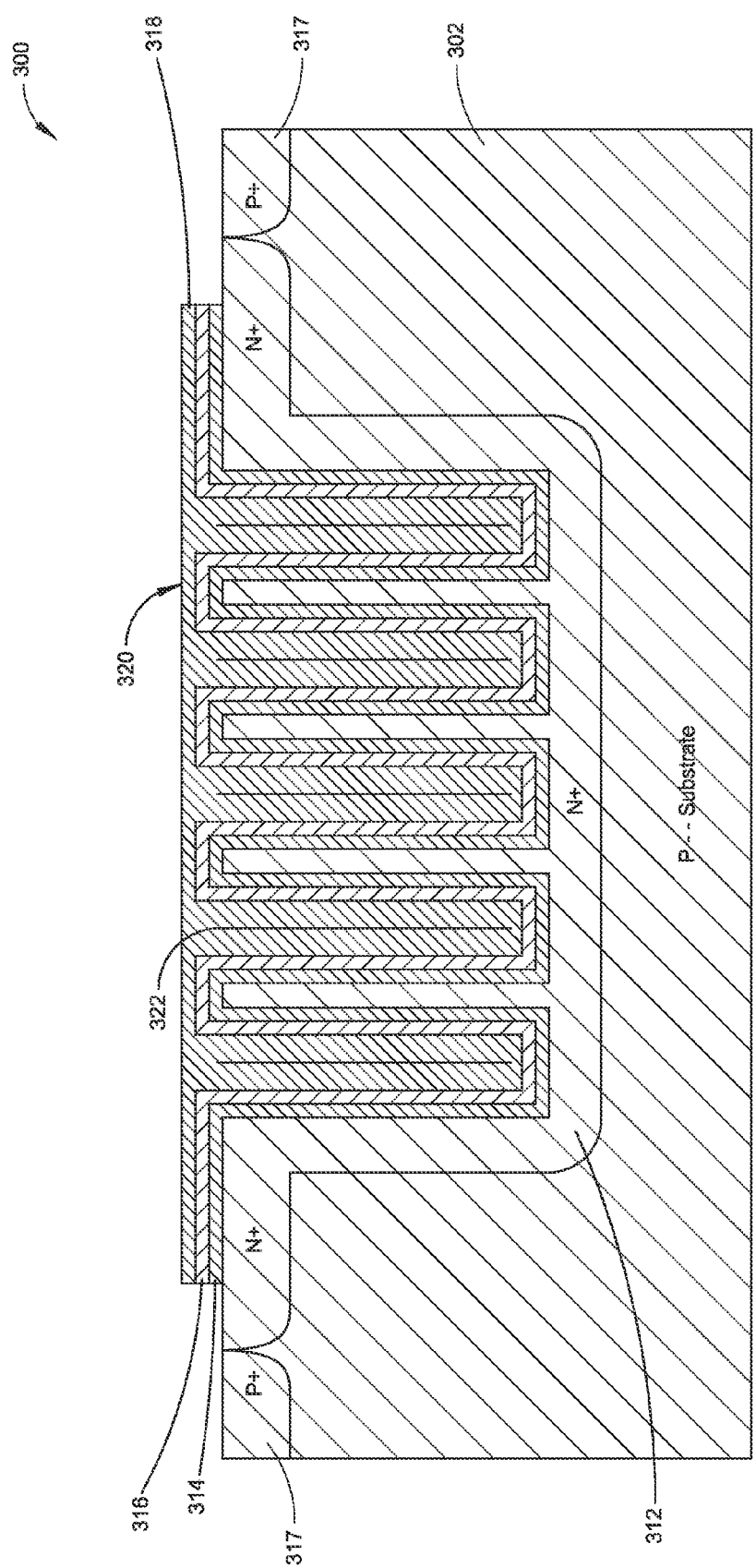

A capacitor is formed within the semiconductor wafer (Block 208). As shown in FIG. 3D, the hardmask layer 304 is removed from the wafer 302 (e.g., stripped). A first electrode 314 (e.g., TiN) is formed over the wafer 302 and within the trenches 308. Next, a dielectric layer 316 (high-k material) is formed over the first electrode 314. A second electrode 318 is then formed over the dielectric layer 316 to form a capacitor 320. As described above, the second electrode 318 may include an additional conductive layer (e.g., a doped polysilicon-oxide-amorphous silicon layer, a doped silicon germanium layer, or the like) to increase the thickness of the second electrode 318. As a result of the deposition, the second electrode 318 defines one or more seams 322 that provide stress management to the device 300. In one or more implementations, the electrodes 314, 318 and the dielectric layer 316 may be deposited over the wafer 302 and the trenches 308 through suitable atomic layer deposition or thermal chemical deposition processes. Multiple isolation regions 317 may be deposited proximate to the surface 306 of the wafer 302. As shown in FIG. 3D, the isolation regions 317 comprise P+ doped regions that assist in electrically isolating the capacitor 320 from other components (e.g., capacitors, integrated circuits, etc.) formed within the wafer 302 (e.g., formed on the same die as the capacitor 320, etc.).

FIG. 3D illustrates a capacitor 320 in a single MIM capacitor configuration. However, it is contemplated that a dual MIM capacitor configuration may be utilized as well (see FIG. 2B). For example, a second dielectric layer may be deposited over the second electrode, and a third electrode may be formed over the second dielectric layer to form a dual MIM capacitor. In this configuration, the third electrode layer may define the seams 322 and include the additional conductive layer, as described above.

Figure 3E:
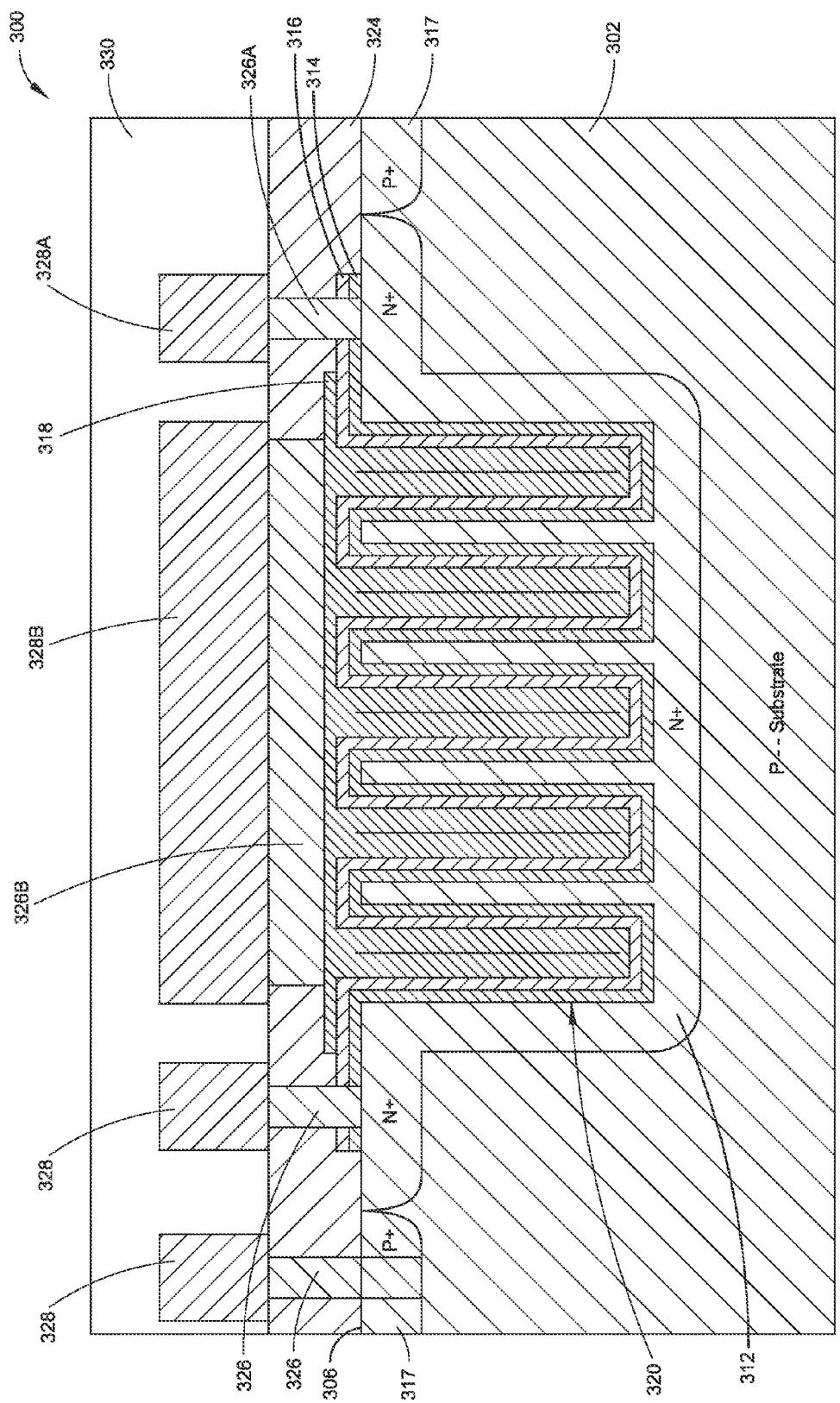

An insulation layer is formed over the semiconductor wafer (Block 210). As shown in FIG. 3E, an insulation layer 324 is formed over the surface 306 of the wafer 302. The insulation layer 324 may be a benzocyclobutene polymer (BCB) layer, a Polyimide (PI) layer, a Polybenzoxazole (PBO) layer, a silicon dioxide ($SiO_2$) layer, and so forth. The insulation layer 324 serves to provide insulation to the capacitor 320 during later semiconductor processing steps.

One or more conductive layers are formed (and electrically connected to the electrodes of the capacitor) over the wafer (Block 212). As shown in FIG. 3E, one or more vias 326 are formed within the insulation layer 324. For example, the insulation layer 324 may be selectively patterned and etched to form via regions. A layer of silicon nitride (SiN), silicon oxynitride (SiON), or like material may be used as an etch-stop over electrode regions to facilitate via etching. A conductive material is then deposited within the via regions to form the vias 326. The vias 326 provide an electrical interconnection with the conductive layers 328, which are formed (e.g., deposited) over the insulation layer 324. In an implementation, a first conductive layer 328 may be electrically connected to the first electrode 314 by a first via 326A, and a second conductive layer 328B may be electrically connected to the second electrode 318 by a second via 326B.

A passivation layer is formed over the semiconductor wafer (Block 214). As shown in FIG. 3E, a passivation layer 330 may be formed over the surface 306 of the wafer 302. In an implementation, the passivation layer 330 at least partially encapsulates the conductive layers 328. The passivation layer 330 may be a stack of oxide/nitride material (SiO$_2$/SiN), or the like.

Conclusion

Although the subject matter has been described in language specific to structural features and/or process operations, it is to be understood that the subject matter defined in the appended claims is not necessarily limited to the specific features or acts described above. Rather, the specific features and acts described above are disclosed as example forms of implementing the claims.

What is claimed is:

1. A semiconductor device comprising:
   a substrate having dopant material of a first conductivity type;
   a plurality of trenches disposed within the substrate;
   a diffusion region disposed proximate to the plurality of trenches, the diffusion region having dopant material of a second conductivity type; and
   a metal-insulator-metal (MIM) capacitor formed within each trench of the plurality of trenches
   wherein the plurality of trenches have an aspect ratio ranging from about one hundred and twenty-five to one (125:1) to about one hundred and fifty to one (150:1) such that the metal-insulator-metal capacitor comprises a capacitive density ranging from three hundred femtoFarads per square micrometer (300 fF/um$^2$) to two thousand femtoFarads per square micrometer (2,000 fF/um$^2$).

2. The semiconductor device as recited in claim 1, wherein the metal-insulator-metal capacitor includes a seam for facilitating stress management.

3. The semiconductor device as recited in claim 1, wherein the metal-insulator-metal capacitor includes a low-stress conductive layer to fill and seal the plurality of trenches after formation of the metal-insulator-metal capacitor.

4. The semiconductor device as recited in claim 1, wherein the metal-insulator-metal capacitor includes a first electrode, a second electrode, and a dielectric layer disposed between the first electrode and the second electrode.

5. The semiconductor device as recited in claim 4, wherein at least one of the first electrode or the second electrode is titanium-nitride.

6. The semiconductor device as recited in claim 4, wherein the dielectric layer is a high-k material.

7. The semiconductor device as recited in claim 1, wherein the diffusion region is self-aligned to the plurality of trenches.

8. The semiconductor device as recited in claim 1, wherein the regions between capacitors are doped with higher but same-polarity dopant type as the substrate.

9. A method comprising:
   forming a plurality of trenches within a semiconductor wafer, the semiconductor wafer including dopant material of a first conductivity type;
   forming a diffusion region proximate to the plurality of trenches, the diffusion region including dopant material of a second conductivity type; and
   forming a metal-insulator-metal (MIM) capacitor within each trench of the plurality of trenches and at least partially over the semiconductor wafer,
   wherein the plurality of trenches have an aspect ratio ranging from about one hundred and twenty-five to one (125:1) to about one hundred and fifty to one (150:1) such that the metal-insulator-metal capacitor comprises a capacitive density ranging from three hundred femtoFarads per square micrometer (300 fF/um$^2$) to two thousand femtoFarads per square micrometer (2,000 fF/um$^2$).

10. The method as recited in claim 9, wherein the metal-insulator-metal capacitor includes a seam for facilitating stress management.

11. The method as recited in claim 9, wherein the metal-insulator-metal capacitor includes a low-stress conductive layer to fill and seal the trenches after formation of the capacitor.

12. The method as recited in claim 9, wherein forming a metal-insulator-metal (MIM) capacitor further comprises forming a first electrode within each trench of the plurality of trenches and at least partially over the semiconductor wafer; forming a dielectric layer at least partially over the first electrode; and forming a second electrode at least partially over the dielectric layer.

13. The method as recited in claim 9, wherein the diffusion region is self-aligned to the plurality of trenches.

14. The method as recited in claim 9, wherein the regions between capacitors are doped with higher but same-polarity dopant type as the substrate.

15. A semiconductor device comprising:
   a substrate having dopant material of a first conductivity type;
   a plurality of trenches disposed within the substrate;
   a diffusion region disposed proximate to the plurality of trenches, the diffusion region having dopant material of a second conductivity type; and
   a dual metal-insulator-metal (MIM) capacitor formed within each trench of the plurality of trenches,
   wherein the plurality of trenches have an aspect ratio ranging from about one hundred and twenty-five to one (125:1) to about one hundred and fifty to one (150:1) such that the metal-insulator-metal capacitor comprises a capacitive density ranging from three hundred femtoFarads per square micrometer (300 fF/um$^2$) to two thousand femtoFarads per square micrometer (2,000 fF/um$^2$).

16. The semiconductor device as recited in claim 15, wherein an etch-stop layer is disposed over the second electrode.

17. The semiconductor device as recited in claim 16, wherein the etch-stop layer is at least one of silicon-nitride or silicon oxynitride.

18. The semiconductor device as recited in claim 15, wherein the second electrode is thickened by an alternating composition of titanium-nitride-doped polysilicon-titanium-nitride.

* * * * *